US012125861B2

(12) United States Patent
Spooren et al.

(10) Patent No.: US 12,125,861 B2
(45) Date of Patent: Oct. 22, 2024

(54) SPECTRAL SENSORS

(71) Applicant: IMEC VZW, Leuven (BE)

(72) Inventors: Nick Spooren, Mechelen (BE); Bert Geelen, Leuven (BE)

(73) Assignee: IMEC VZW, Leuven (BE)

( * ) Notice: Subject to any disclaimer, the term of this patent is extended or adjusted under 35 U.S.C. 154(b) by 527 days.

(21) Appl. No.: 17/177,190

(22) Filed: Feb. 16, 2021

(65) Prior Publication Data

US 2021/0257398 A1 Aug. 19, 2021

(30) Foreign Application Priority Data

Feb. 18, 2020 (EP) ...................... 20157949

(51) Int. Cl.
*H01L 27/146* (2006.01)
(52) U.S. Cl.
CPC .. *H01L 27/14621* (2013.01); *H01L 27/14623* (2013.01); *H01L 27/14627* (2013.01); *H01L 27/14643* (2013.01)
(58) Field of Classification Search
CPC ......... H01L 27/14621; H01L 27/14627; H01L 27/14643; H01L 27/146; H01L 27/14623
USPC .................. 257/432, 431, 428, 414
See application file for complete search history.

(56) References Cited

U.S. PATENT DOCUMENTS

| | | | | |
|---|---|---|---|---|
| 7,560,684 | B2 * | 7/2009 | Matsuda | H04N 23/12 |
| | | | | 356/402 |
| 9,103,986 | B2 * | 8/2015 | Margalit | G02B 5/287 |
| 11,594,562 | B2 * | 2/2023 | Nakajun | H01L 27/14627 |
| 2011/0032398 | A1 * | 2/2011 | Lenchenkov | H01L 27/14621 |
| | | | | 257/E31.127 |
| 2018/0288306 | A1 * | 10/2018 | Lay | H04N 23/67 |
| 2019/0115378 | A1 | 4/2019 | Nakajun et al. | |

OTHER PUBLICATIONS

Catrysse et al., "Optical efficiency of image sensor pixels." 1610. J. Opt. Soc. Am. A/vol. 19, No. 8/Aug. 2002.
Spooren et al., "RGB-NIR active gated imaging." (2016), 998704. doi:10.1117/12.2239603.
Zhang et al., "Optical design of microlens array for CMOS image sensors", (2016), Proceedings vol. 9685, 8th International Symposium on Advanced Optical Manufacturing and Testing Technologies Design.
Geelen et al., "System-level analysis and design for RGB-NIR CMOS camera.", (2017), 101100B. DOI:10.1117/12.2250852.

(Continued)

*Primary Examiner* — David A Zarneke
(74) *Attorney, Agent, or Firm* — MOSER TABOADA

(57) ABSTRACT

The present invention relates to a spectral sensor. The spectral sensor comprising: a light detecting element; a microlens; and an interference filter arranged between the light detecting element and the microlens, and configured to transmit light in one or more spectral bands; wherein the microlens has an effective focal length (F) exceeding a distance (D) between the microlens and the light detecting element. The microlens may be configured such that light refracted by the microlens, to be transmitted through the interference filter, converges towards a position (P) behind the light detecting element. The present invention further relates to an image sensor comprising a plurality of spectral sensors.

20 Claims, 2 Drawing Sheets

(56) References Cited

OTHER PUBLICATIONS

Goossens et al., "Finite aperture correction for spectral cameras with integrated thin-film Fabry-Perot filters.", Appl. Opt. 57, 7539-7549 (2018).
Vereecke et al., "Fabrication of a CMOS-based Imaging Chip with Monolithically Integrated RGB and NIR Filters.", (2019), Proceedings. 2. 751. doi:10.3390/proceedings2130751.

* cited by examiner

SPECTRAL SENSORS

CROSS REFERENCE TO RELATED APPLICATIONS

This application claims priority to the European Patent Application EPC, No. 20157949.7, filed on Feb. 18, 2020, which is incorporated herein by reference.

TECHNICAL FIELD

The present invention relates to spectral sensors and an image sensor comprising a plurality of spectral sensors.

BACKGROUND OF THE INVENTION

There are many applications in which it is desirable to acquire spectral images of an object. In this type of imaging, spectral information of an object is detected in multiple narrow ranges of wavelengths. Two such techniques are called multispectral imaging and hyperspectral imaging, and while no definitions have been established, multispectral imaging typically refers to spectral imaging using a plurality of discrete wavelength bands, whereas hyperspectral imaging refers to imaging narrow spectral wavelength bands over a continuous spectral range. Hyperspectral imaging may also often use a larger number of spectral bands than what is used in multispectral imaging.

With advances to semiconductor fabrication, it is now possible to produce image sensors based on complementary metal-oxide-semiconductor (CMOS) technology, wherein a substrate comprising an array of light detecting elements is integrated with filters for selectively transmitting light to the light detecting element The integrated filters may define different spectral bands associated with different light detecting elements. For instance, spectral bands may be associated with different rows of light detecting elements, such that when a line scan is performed, an image of high spectral and spatial resolution may be acquired. Alternatively, a mosaic configuration of spectral bands may be arranged on the array of light detecting elements, such that a set of light detecting elements is associated with a plurality of filters and may together acquire spectral information of a portion of an object. An image sensor having a mosaic configuration of filters may be used for acquiring an image with a spectral resolution in a single exposure.

The spectral range of these integrated filters, implemented by stacking alternating layers of low and high refractive index, depends heavily on the contrast in the refractive index of the materials. However, due to their spectral selectivity, the filters inherently reduce the amount of light reaching the light detecting elements, which in turn reduces the sensitivity. In other words, in order to achieve the spectral selectivity, the sensitivity is reduced.

SUMMARY OF THE INVENTION

According to a first aspect a spectral sensor is provided. The spectral sensor comprising: a light detecting element; a microlens; and an interference filter arranged between the light detecting element and the microlens, and configured to transmit light in one or more spectral bands; wherein the microlens has an effective focal length exceeding a distance between the microlens and the light detecting element.

Within the context of this disclosure, "light detecting element" is to be construed as a structure sensitive to light, e.g. a photo-diode of a pixel of an image sensor. In any case, "light detecting element" may comprise a light sensitive volume (e.g. a depletion zone of a PN-junction).

Within the context of this disclosure, the term "microlens" may for example be construed as a lens having a diameter in a range from 1 µm to 15 µm. The microlens may be a positive lens, i.e. collimated light incident on the microlens is converging subsequent to being refracted by the microlens. Such a lens may also be called a converging lens. The microlens may, e.g., be a plano-convex lens, a graded index (GRIN) lens, a Fresnel lens etc. Generally, the diameter of a microlens may relate to the pixel pitch, wherein a typical pixel pitch includes sizes in a range from 1 µm to and 15 µm.

Within the context of this disclosure, "interference filter" is to be construed as a structure having at least two or, preferably, multiple layers, and that allows transmission of certain wavelengths by utilizing interference effects for light propagating through the interference filter. Due to the construction of interference filters, which wavelengths that are transmitted through it are usually highly dependent on the angle (commonly referred to as the angle of incidence) with which light is incident on the interference filter. Interference filters are typically designed to transmit wavelengths within one or more spectral bands for light having a design angle of incidence (e.g. normal incidence) on the interference filter. However, for light incident on the interference filter with angles different from the design angle of incidence, the one or more spectral bands for light transmitted through the interference filter may be shifted in wavelength.

Within the context of this disclosure, "effective focal length" is to be construed as a distance from the microlens to a position at which collimated light incident on, and refracted by, the microlens converges. This position may within the art be referred to as the principal focus. At this position, the light refracted by the microlens, if allowed to freely propagate after the microlens, reaches a smallest light spot size. For an ideal lens, the smallest spot size may correspond to the diffraction-limited spot size. Further, converging and diverging light incident on the microlens reaches a smallest spot size at distances different from the effective focal length. As is generally known within the art, the effective focal length may be different for different wavelengths of light.

The inventors have realized that a spectral sensor having an enhanced sensitivity and spectral selectivity is possible by configuring the microlens such that the smallest light spot size is positioned behind the light detecting element associated with the microlens. In a conventional configuration, microlenses may be used to increase the amount of light reaching light detecting elements of an image sensor such that the smallest light spot size coincides with the light detecting element (e.g. the sensor plane) in order to increase the light intensity incident on the light detecting element. However, as the inventors have realized, using the conventional configuration of the microlens in the spectral sensor may shift a peak transmission wavelength for light transmitted through the interference filter and may increase a full width at half maximum (FWHM) of the transmission peak of light transmitted through the interference filter. This is an effect of converging light propagating through the interference filter, since the wavelength of light that is transmitted through the interference filter depends on the angle (relative to, e.g., the normal of the interference filter) with which the light propagates through the interference filter. Hence, in case the angular range with which light propagates through the interference filter is increased (e.g., through focusing by the microlens), so may the range of wavelengths that are transmitted through the interference filter. This means that the spectral selectivity of the spectral sensor may be reduced when using a conventional configuration of the microlens in the spectral sensor. By means of the present inventive concept, light strikes the interference filter with smaller variation of angles relative to the design angle of incidence (e.g. normal incidence) of the interference filter than for the conventional configuration of the microlens. In other words, a larger fraction of the light strikes the interference filter at more similar angles. In this way, the fraction of light within the one or more spectral bands transmitted through the interference filter may be increased. Thus, the sensitivity and the spectral selectivity of the spectral sensor may be enhanced compared to a spectral sensor having a conventional configuration of the microlens.

The microlens may be configured to direct light in the one or more spectral bands towards the light detecting element and through the interference filter.

The interference filter may comprise a first multilayer and a second multilayer separated by an intermediate layer.

The first multilayer and/or the second multilayer may comprise alternating layers of different materials having different refractive indices and/or thicknesses.

The microlens may be configured such that light refracted by the microlens, to be transmitted through the interference filter, converges towards a position behind the light detecting element, e.g. a position behind a light sensitive volume of the light detecting element.

The effective focal length of the microlens may exceed the distance between the microlens and the light detecting element, at least for light having a wavelength within the one or more spectral bands.

According to a second aspect a spectral sensor is provided. The spectral sensor comprising: a light detecting element; a microlens; and an interference filter arranged between the light detecting element and the microlens, and configured to transmit light in one or more spectral bands (e.g. within a wavelength range); wherein the microlens is configured such that light (e.g. within the wavelength range) refracted by the microlens, to be transmitted through the interference filter, converges towards a position behind the light detecting element.

"Behind the light detecting element" should here be understood as seen in a direction of the light incident on the light detecting element. The microlens may be configured such that light (e.g. in the one or more spectral bands within the wavelength range) refracted by the microlens, to be transmitted through the interference filter, converges towards a position behind a light sensitive volume of the light detecting element.

The above-mentioned features of the first aspect, when applicable, apply to this second aspect as well. In order to avoid undue repetition, reference is made to the above.

The interference filter may comprise a first multilayer and a second multilayer separated by an intermediate layer.

The first multilayer and/or the second multilayer may comprise alternating layers of different materials having different refractive indices and/or thicknesses.

An effective focal length of the microlens may exceed a distance between the microlens and the light detecting element, at least for light having a wavelength within the one or more spectral bands.

According to a third aspect an image sensor is provided. The image sensor comprising: a plurality of spectral sensors according to any preceding aspect; and wherein the interference filters of at least two of the spectral sensors are configured to transmit light in different spectral bands.

In view of the above discussion in connection with the first aspect, it may be appreciated that an advantage of the third aspect is that an image sensor capable of spectral imaging having an enhanced sensitivity and spectral selectivity is allowed. The above-mentioned features of the first aspect and the second aspect, when applicable, apply to this third aspect as well. In order to avoid undue repetition, reference is made to the above.

The light detecting element(s) (of any of the first through third aspects) may be formed as active pixels in a complementary metal-oxide-semiconductor (CMOS) substrate, and wherein the interference filter(s) and/or the microlense(s) are monolithically integrated with the CMOS substrate.

A further scope of applicability of the present disclosure will become apparent from the detailed description given below. However, it should be understood that the detailed description and specific examples, while indicating preferred variants of the present inventive concept, are given by way of illustration only, since various changes and modifications within the scope of the inventive concept will become apparent to those skilled in the art from this detailed description.

Hence, it is to be understood that this inventive concept is not limited to the particular component parts of the spectral sensors and image sensor described as such may vary. It is also to be understood that the terminology used herein is for purpose of describing particular embodiments only and is not intended to be limiting. It must be noted that, as used in the specification and the appended claim, the articles "a", "an", "the", and "said" are intended to mean that there are one or more of the elements unless the context clearly dictates otherwise. Furthermore, the words "comprising", "including", "containing" and similar wordings do not exclude other elements or steps.

BRIEF DESCRIPTION OF THE DRAWINGS

The above and other aspects of the present inventive concept will now be described in more detail, with reference to appended drawings showing variants of the invention. The figures should not be considered limiting the invention to the specific variant; instead they are used for explaining and understanding the inventive concept.

As illustrated in the figures, the sizes of layers and regions are exaggerated for illustrative purposes and, thus, are provided to illustrate the general structures of variants of the present inventive concept. Like reference numerals refer to like elements throughout.

DETAILED DESCRIPTION

The present inventive concept will now be described with reference to the accompanying drawings, in which currently preferred variants of the inventive concept are shown. This inventive concept may, however, be implemented in many different forms and should not be construed as limited to the variants set forth herein.

Figure 1:
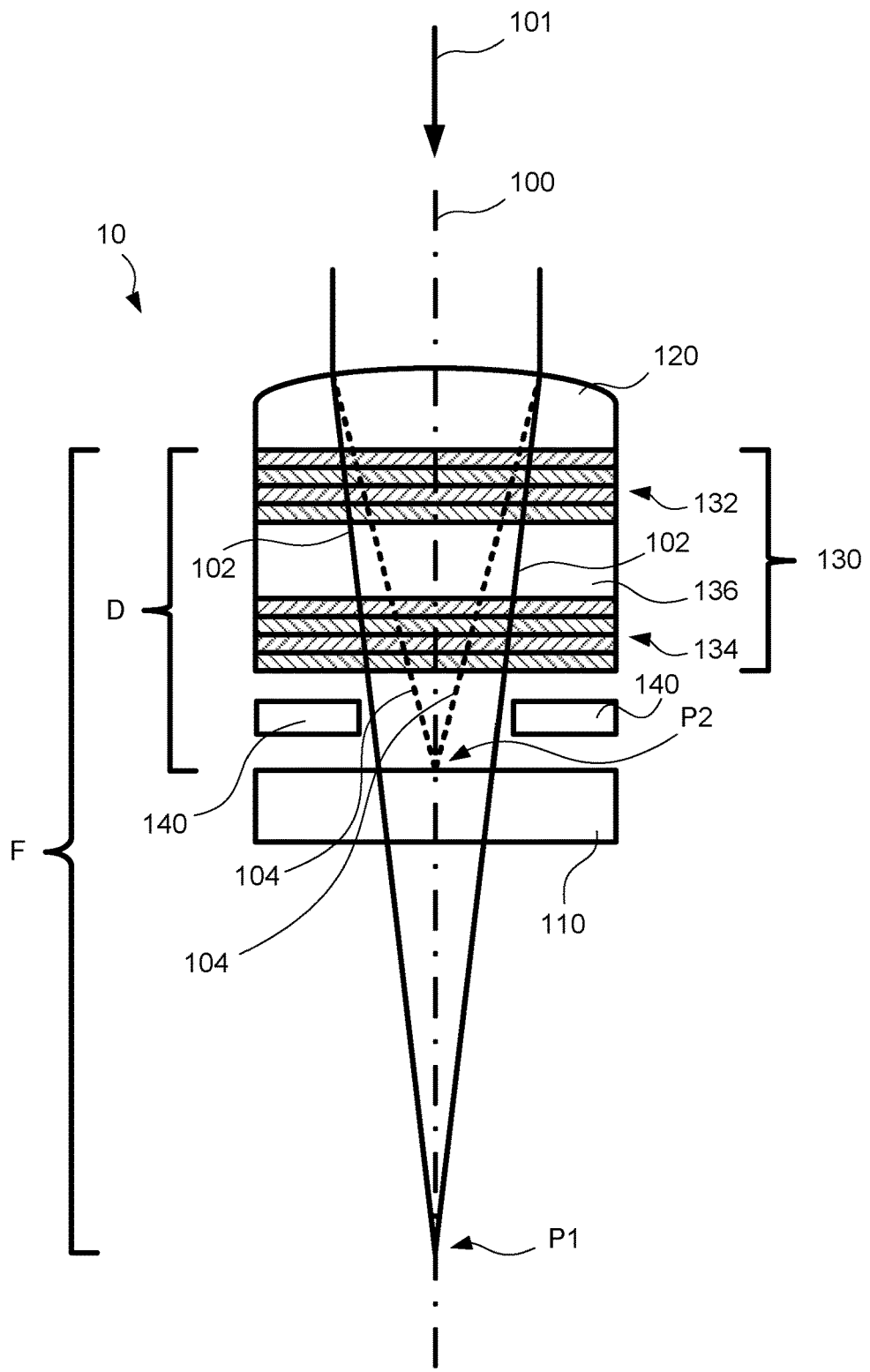
FIG. 1 illustrates a spectral sensor.

FIG. 1 illustrates a spectral sensor 10. The spectral sensor 10 comprises a light detecting element 110, a microlens 120, and an interference filter 130. The spectral sensor 10 may further comprise circuitry for conveying control signals, read-out signals etc. to/from the pixel, as schematically represented by metal layer 140 in FIG. 1. An optical axis 100 of the spectral sensor 10 is further illustrated in FIG. 1. The optical axis 100 may be parallel to a normal (not shown in FIG. 1) of the interference filter 130, as is the case in the example of FIG. 1. A general direction of light incident on the spectral sensor 10 is represented by arrow 101 in FIG. 1.

The light detecting element 110 may, e.g., be a semiconductor photo-diode such as of a complementary metal-oxide semiconductor (CMOS) or a charge-coupled device (CCD) image sensor, or an organic photo-diode (OPD). In any case, the light detecting element 110 may comprise a light sensitive volume, e.g. of a PN-junction or PIN-junction formed in a substrate of the spectral sensor 10.

The interference filter 130 is arranged between the light detecting element 110 and the microlens 120. The microlens 120 may be configured to direct light towards the light detecting element 110 through the interference filter 130.

The interference filter 130 is configured to transmit light in one or more spectral bands. Which spectral bands that the interference filter 130 transmits light within depends on the angle with which the light strikes the interference filter 130. Typically, the one or more spectral bands are defined for light striking the interference filter 130 within a narrow range of angles relative to the normal of the interference filter 130. Thus, the fraction of light within the one or more spectral bands transmitted through the interference filter 130 and reaching the light detecting element 110 depends on the angles with which the light strikes the interference filter 130. Typically, increasing the range of angles changes the characteristics of a response of the interference filter 130. For example, increasing the range of angles may increase the FWHM of the transmission peak of light transmitted through the interference filter 130.

The interference filter 130 may comprise a first multilayer 132 and a second multilayer 134 separated by an intermediate layer 136. The first multilayer 132, the second multilayer 134 and the intermediate layer 136 may be configured such that the interference filter 130 provides constructive interference for light in the one or more spectral bands. In other words, light in the one or more spectral bands is allowed to propagate through the interference filter 130, while light not in the one or more spectral bands is reflected by the interference filter 130.

The first multilayer 132 and the second multilayer 134 may comprise alternating layers of different materials having different refractive indices as is shown in the example of FIG. 1. For example, the first multilayer 132 may comprise an alternating sequence of first layers of a material "A" and second layers of a material "B", e.g. "ABABAB". In FIG. 1, the alternating layers of the first multilayer 132 and the second multilayer 134 are shown as having a constant thickness, however, it is to be understood that the alternating layers of first multilayer 132 and/or the second multilayer 134 may further have different thicknesses.

The spectral sensor 10 may be configured to sense light having wavelengths in the ultraviolet (UV) range, visible range, infrared (IR) range, far IR range, etc. It is to be understood that the light detecting element 110, the microlens 120, and the interference filter 130 may be chosen depending on the wavelength range the spectral sensor 10 is designed to sense.

As is seen in FIG. 1, the microlens 120 is configured such that light refracted by the microlens 120, to be transmitted through the interference filter 130, converges towards a position P1 behind the light detecting element 110. In other words, the microlens 120 has an effective focal length F exceeding a distance D between the microlens 120 and the light detecting element 110, as indicated in FIG. 1. The distance D here refers to the distance between a principal plane of the microlens 120 to the light detecting element 110, i.e. the light sensitive volume of the light detecting element 110. Correspondingly, the effective focal length F may be the distance from the principal plane of the microlens 120 to the position P1. Thus, the position P1 may lie behind the light sensitive volume of the light detecting element 110.

This configuration may hereinafter be referenced to as the defocused configuration. The effective focal length F of the microlens may exceed the distance D between the microlens and the light detecting element, at least for light having a wavelength within the one or more spectral bands.

Using the defocused configuration, light strikes the interference filter 130 with smaller angles relative to the normal of the interference filter 130 than for a conventional configuration of the microlens 120. In a conventional configuration of the microlens 120 is typically configured such that light converges towards a position P2 coinciding with the light detecting element 110 in order to increase the light intensity on the light detecting element 110.

In FIG. 1, the effect on light associated with the defocused configuration is shown using solid lines 102, and the effect on light associated with the conventional configuration is shown using dashed lines 104. As is clearly seen in FIG. 1, the light associated with the defocused configuration strikes the interference filter 130 with smaller angles relative to the normal of the interference filter 130 (or relative to the optical axis 100 in FIG. 1) compared to light associated with the conventional configuration. As an example, light may strike the interference filter 130 with angles relative to the normal of the interference filter 130 below 10°-15° when using the defocused configuration. Thus, the fraction of light within the one or more spectral bands transmitted through the interference filter 130 is increased using the defocused configuration compared to the conventional configuration. Put differently, a larger fraction of the light cone defined by the solid lines in FIG. 1 (i.e. light associated with the defocused configuration) having a wavelength within the one or more spectral bands is transmitted through the interference filter 130 compared to the light cone defined by the dashed lines in FIG. 1 (i.e. light associated with the conventional configuration). Thus, the sensitivity and the spectral selectivity of the spectral sensor 10 is enhanced by increasing the amount of light in the one or more spectral bands reaching the light detecting element 110.

As is understood from FIG. 1, the configuration of the microlens 120 may allow light transmitted through the interference filter 130 to pass through an opening in the metal layer 140, if present. In case the microlens 120 is not present, light incident on near the edges of the spectral sensor 10 may be intercepted by the metal layer 140, and hence not detected by the light detecting element 110. Thus, the configuration of the microlens 120 may be a balance between the angle with which the light is transmitted through the interference filter 130 (i.e. the spectral selectivity of the interference filter 130) and the light intensity (i.e. the light spot size) on the light detecting element 110.

According to some non-limiting examples, a distance (e.g. a Snell distance) between a microlens (e.g. 120) and a position (e.g. P1) towards which light refracted by the microlens to be transmitted through the interference filter (e.g. 130) converges, may be at least twice (i.e. a factor of ≥2 or greater than) a distance (e.g. a Snell distance) between the microlens and the light detecting element (e.g. the light sensitive volume of the light detecting element 110). "Snell distance" (or "refractive height") of a layer with index of refraction n and thickness d is hereby defined as d/n, in order to represent the change in tilt angles in a medium with index of refraction n due to Snell's law.

Figure 2:
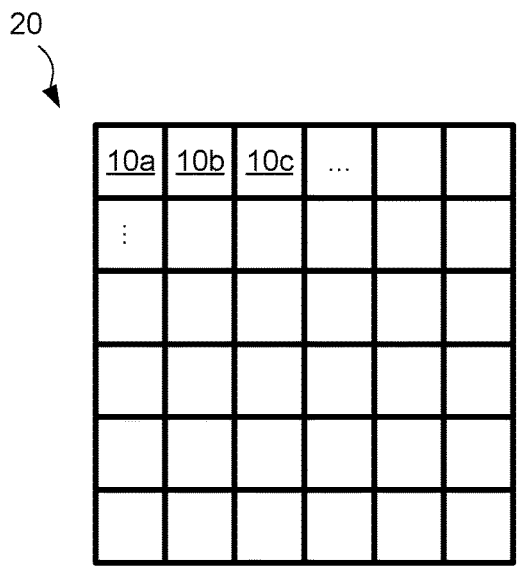
FIG. 2 illustrates an image sensor comprising a plurality of spectral sensors.

FIG. 2 illustrates an image sensor 20 comprising a plurality of spectral sensors 10. The plurality of spectral sensors 10 may be arranged in an array comprising a plurality of rows and columns. Each spectral sensor 10 of the plurality of spectral sensors may be associated with its own interference filter and/or microlens. Two or more neighboring adjacent spectral sensors 10 may share a single interference filter 130 and/or microlens 120. The image sensor 20 shown in FIG. 2 comprises a certain number of spectral sensors 10, however, it is to be understood that this is an example only and the number of spectral sensors 10 may vary.

The image sensor 20 may be comprised in a camera (not shown). The camera may further comprise an imaging system (not shown). The imaging system may be a camera objective (not shown). It is to be understood that the configuration of the microlens 120 may be adapted to the imaging system, since the light collected by the imaging system may be converging as it reaches the microlens 120. In other words, the configuration of the microlens 120 may be adapted to the imaging system such that light collected by the imaging system and directed towards the microlens 120 converges towards the position P1 behind the light detecting element 110 of the spectral sensor 10.

Figure 3:
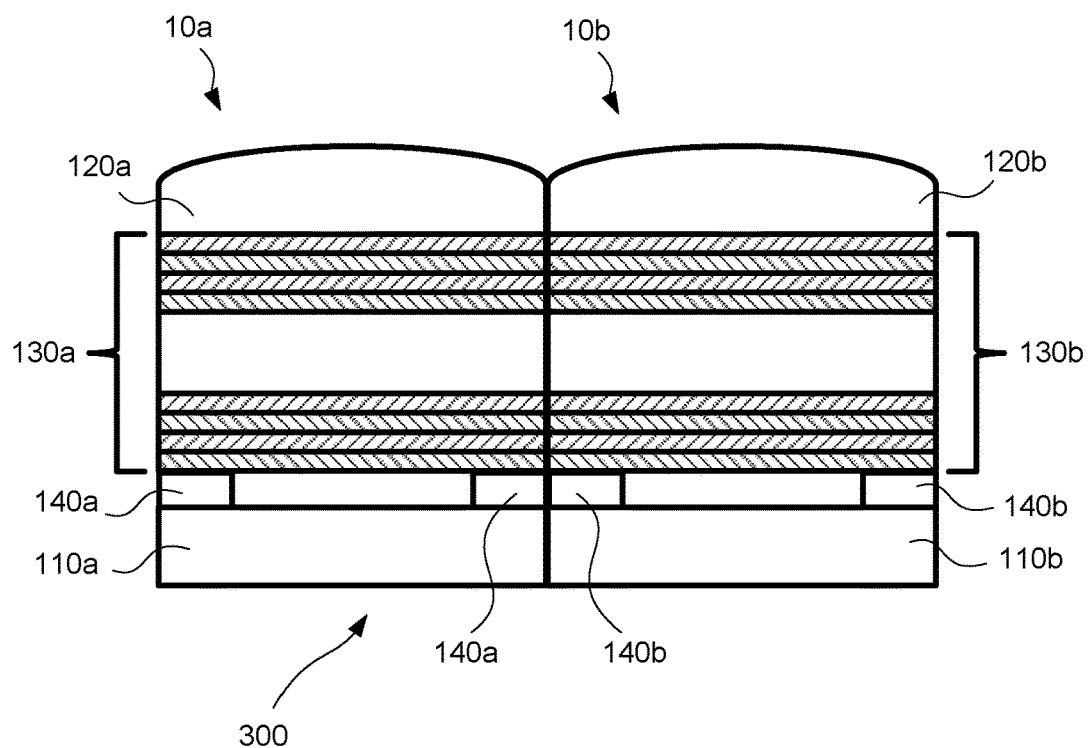
FIG. 3 illustrates two spectral sensors of the image sensor of FIG. 2.

FIG. 3 illustrates a first spectral sensor 10a and a second spectral sensor 10b of the image sensor 20 of FIG. 2. The light detecting elements 10a, 10b of the first and second spectral sensor 10a, 10b may be formed as active pixels in a complementary metal-oxide-semiconductor (CMOS) substrate or chip 300 as is shown in the example of FIG. 3. The first spectral sensor 10a and the second spectral sensor 10b may be monolithically integrated with the CMOS substrate 300 as is further shown in the example of FIG. 3. The interference filter 130a of the first spectral sensor 10a is configured to transmit light in a first set of spectral bands, and the interference filter 130b of the second spectral sensor 10b is configured to transmit light in a second set of spectral bands. The first set of spectral bands is different from the second set of spectral bands. Hence, spectral imaging using the image sensor is allowed.

It is to be understood that interference filters of neighboring spectral sensors may be configured to transmit light in identical or similar spectral bands, even though the first and second spectral sensor 10a, 10b are illustrated as being neighboring spectral sensors in FIG. 3.

The person skilled in the art realizes that the present inventive concept by no means is limited to the preferred variants described above. On the contrary, many modifications and variations are possible within the scope of the appended claims.

For example, the microlens 120 is shown in FIG. 1 as being a plano-convex lens. However, other types of microlenses 120 may be used, e.g., graded index (GRIN) lenses, Fresnel lenses etc.

Additionally, variations to the disclosed variants can be understood and effected by the skilled person in practicing the claimed invention, from a study of the drawings, the disclosure, and the appended claims.

The invention claimed is:
1. A spectral sensor comprising:
  a light detecting element being an active pixel in a complementary metal-oxide-semiconductor, CMOS, substrate;
  circuitry configured to convey control signals and/or read-out signals to the active pixel, the circuitry comprising an opening in a metal layer;
  a microlens; and
  an interference filter arranged below the microlens, the circuitry being arranged below the interference filter, and the active pixel being arranged below the circuitry,
  wherein the interference filter is configured to transmit light in one or more spectral bands, the interference filter comprising at least two layers of different materials having different refractive indices and/or thicknesses,
  wherein the circuitry is configured to allow light transmitted through the interference filter to pass through the opening in the metal layer of the circuitry to the active pixel, and
  wherein a lateral extension of the opening of the metal layer is smaller than a lateral extension of the light detecting element, and wherein the microlens has an effective focal length exceeding a distance between the microlens and the opening of the metal layer as well as exceeding a distance between the microlens and the light detecting element.

2. The spectral sensor according to claim 1, wherein the microlens is configured to direct light in said one or more spectral bands towards the light detecting element and through the interference filter.

3. The spectral sensor according to claim 1, wherein the interference filter comprises a first multilayer and a second multilayer separated by an intermediate layer.

4. The spectral sensor according to claim 3, wherein the first multilayer and/or the second multilayer comprises alternating layers of different materials having different refractive indices and/or thicknesses.

5. The spectral sensor according to claim 1, wherein the microlens is configured such that light refracted by the microlens, to be transmitted through the interference filter, converges towards a position behind the light detecting element.

6. The spectral sensor according to claim 1, wherein the effective focal length of the microlens exceeds the distance between the microlens and the light detecting element, at least for light having a wavelength within the one or more spectral bands.

7. The spectral sensor according to claim 1, wherein the effective focal length is at least at least twice a distance between the microlens and the light detecting element.

8. The spectral sensor according to claim 1, wherein the microlens is configured such that light strikes the interference filter with angles, relative to a normal of the interference filter, below 15°.

9. A spectral sensor comprising:
  a light detecting element being an active pixel in a complementary metal-oxide-semiconductor, CMOS, substrate;
  circuitry configured to convey control signals and/or read-out signals to the active pixel, the circuitry comprising an opening in a metal layer;
  a microlens; and
  an interference filter arranged below the microlens, the circuitry being arranged below the interference filter, and the active pixel being arranged below the circuitry,
  wherein the interference filter is configured to transmit light in one or more spectral bands, the interference filter comprising at least two layers of different materials having different refractive indices and/or thicknesses, wherein a lateral extension of the opening of the metal layer is smaller than a lateral extension of the light detecting element, and wherein the microlens is configured such that light refracted by the microlens, to be transmitted through the interference filter, passes through the opening in the metal layer of the circuitry and converges towards a position, the position being behind the opening of the metal layer and behind a light sensitive volume of the light detecting element.

10. The spectral sensor according to claim 9, wherein the interference filter comprises a first multilayer and a second multilayer separated by an intermediate layer.

11. The spectral sensor according to claim 10, wherein the first multilayer and/or the second multilayer comprises alternating layers of different materials having different refractive indices and/or thicknesses.

12. The spectral sensor according to claim 9, wherein an effective focal length of the microlens exceeds a distance between the microlens and the light detecting element, at least for light having a wavelength within the one or more spectral bands.

13. The spectral sensor according to claim 9, wherein a distance between the microlens and the position towards which light refracted by the microlens converges, is at least twice a distance between the microlens and the light detecting element.

14. An image sensor comprising:
a plurality of spectral sensors according to claim 1; and
wherein the interference filters of at least two spectral sensors are configured to transmit light in different spectral bands.

15. The image sensor according to claim 14, wherein the interference filters and/or the microlenses are monolithically integrated with the CMOS substrate.

16. An image sensor comprising:
a plurality of spectral sensors according to claim 9; and
wherein the interference filters of at least two spectral sensors are configured to transmit light in different spectral bands.

17. The image sensor according to claim 16, wherein the interference filters and/or the microlenses are monolithically integrated with the CMOS substrate.

18. The image sensor according to claim 14, wherein the image sensor is a hyperspectral image sensor.

19. The image sensor according to claim 16, wherein the image sensor is a hyperspectral image sensor.

20. The spectral sensor according to claim 9, wherein the microlens is configured such that light strikes the interference filter with angles, relative to a normal of the interference filter, below 15°.

* * * * *